United States Patent
Hatch

(10) Patent No.: US 10,028,875 B2
(45) Date of Patent: Jul. 24, 2018

(54) ELECTRONIC DEVICE MOUNT FOR RELEASABLY ATTACHING TO EQUIPMENT IN A HOSPITAL ROOM

(71) Applicant: Hatchmed Corporation, Seattle, WA (US)

(72) Inventor: Brian Hatch, Seattle, WA (US)

(73) Assignee: HATCHMED CORPORATION, Seattle, WA (US)

(*) Notice: Subject to any disclaimer, the term of this patent is extended or adjusted under 35 U.S.C. 154(b) by 0 days.

(21) Appl. No.: 15/705,105

(22) Filed: Sep. 14, 2017

(65) Prior Publication Data

US 2018/0153751 A1 Jun. 7, 2018

Related U.S. Application Data

(60) Provisional application No. 62/430,761, filed on Dec. 6, 2016.

(51) Int. Cl.
*A47C 21/00* (2006.01)
*A61G 7/05* (2006.01)
(Continued)

(52) U.S. Cl.
CPC ............. *A61G 7/05* (2013.01); *A61G 1/04* (2013.01); *H01R 13/6205* (2013.01);
(Continued)

(58) Field of Classification Search
CPC ...................................................... A47C 21/00
(Continued)

(56) References Cited

U.S. PATENT DOCUMENTS

| 3,942,751 | A |   | 3/1976 | Fay |
| 4,680,790 | A | * | 7/1987 | Packard ................ A61G 7/05 |
|           |   |   |        | 340/286.07 |

(Continued)

FOREIGN PATENT DOCUMENTS

| KR | 20170035851 | 3/2017 |
| WO | 2016155691 | 12/2016 |
| WO | 2016196403 | 12/2016 |

OTHER PUBLICATIONS

"Camera SnakeClamp," Snake Clamp, [online] snakecamp.com, Dec. 12, 2012 [retrieved on Oct. 12, 2017]. Retrieved from the Internet: <URL: https://web.archive.org/web/20121220014228/ https://snakeclamp.com/Category/camera-snakeclamp-with-flex-ible-gooseneck-arm#.WeENSuT2Z9A>, 3 pages.
(Continued)

*Primary Examiner* — Fredrick C Conley
(74) *Attorney, Agent, or Firm* — Kilpatrick Townsend & Stockton LLP

(57) ABSTRACT

A device for attaching a digital device to a hospital bed side rail. The device includes a connector for attaching to the side rail, an arm connected to the connector, and an electronic device holder at an opposite end of the arm. The electronic device holder is configured to receive a digital device, such as a tablet, laptop computer, phone, or other electronic device. The arm is, in embodiments, articulating, flexible, rotatable, and/or otherwise configurable to allow positioning of the electronic device holder in a desired position relative to the patient. Thus, after the connector is attached to the side rail, the arm can be moved to position and support the electronic device holder relative to a patient.

16 Claims, 5 Drawing Sheets

(51) Int. Cl.
*A61G 1/04* (2006.01)
*H01R 13/73* (2006.01)
*H05K 5/02* (2006.01)
*H01R 13/62* (2006.01)

(52) U.S. Cl.
CPC ........... *H01R 13/73* (2013.01); *H05K 5/0217* (2013.01); *H05K 5/0234* (2013.01)

(58) Field of Classification Search
USPC ......................................... 5/658, 503.1, 424
See application file for complete search history.

(56) References Cited

U.S. PATENT DOCUMENTS

| | | | |
|---|---|---|---|
| 5,701,991 | A | 12/1997 | Helmetsie |
| 5,802,636 | A | 9/1998 | Corbin et al. |
| 5,867,821 | A | 2/1999 | Ballantyne et al. |
| 6,206,464 | B1 | 3/2001 | Santa Rosa et al. |
| 6,339,410 | B1 | 1/2002 | Milner et al. |
| 6,486,792 | B1 | 11/2002 | Moster et al. |
| 6,622,980 | B2 | 9/2003 | Boucher et al. |
| 7,349,203 | B2 | 3/2008 | Jobs et al. |
| 7,458,555 | B2 | 12/2008 | Mastropaolo et al. |
| 7,730,565 | B1 | 6/2010 | Masson |
| 7,861,985 | B2 | 1/2011 | Galvin |
| 7,967,137 | B2 | 6/2011 | Fulbrook et al. |
| 7,971,289 | B2 | 7/2011 | Payne et al. |
| 8,011,629 | B2 | 9/2011 | Herskovic |
| 8,020,829 | B1 | 9/2011 | Tamayori |
| 8,461,968 | B2 | 6/2013 | Ball et al. |
| 8,499,384 | B2 | 8/2013 | Zerhusen |
| D692,439 | S | 10/2013 | Muhlenberg |
| 8,602,662 | B1 | 12/2013 | Mans |
| 8,607,388 | B1 | 12/2013 | Flanagan et al. |
| 8,650,682 | B2 | 2/2014 | Herman |
| 8,661,583 | B2 | 3/2014 | Chinn et al. |
| 8,789,802 | B2 | 7/2014 | Springer et al. |
| 8,794,766 | B2 | 8/2014 | Listou |
| 8,994,776 | B2 | 3/2015 | Sutherland et al. |
| 9,038,971 | B1 | 5/2015 | Guthrie |
| 9,286,441 | B2 | 3/2016 | Zerhusen et al. |
| 9,375,374 | B2 | 6/2016 | Herman et al. |
| 9,463,126 | B2 | 10/2016 | Zerhusen et al. |
| D773,465 | S | 12/2016 | Palmer et al. |
| 9,573,686 | B2 | 2/2017 | Barth |
| 2010/0132122 | A1 | 6/2010 | Hollingshead |
| 2012/0026684 | A1 | 2/2012 | Matthews |
| 2012/0215360 | A1 | 8/2012 | Zerhusen et al. |
| 2013/0314866 | A1 | 11/2013 | Millman |
| 2015/0351530 | A1* | 12/2015 | Udagawa ............. H02G 3/0487 108/50.02 |
| 2016/0008197 | A1 | 1/2016 | Zerhusen et al. |
| 2016/0128468 | A1 | 5/2016 | Lafleche et al. |
| 2016/0183393 | A1 | 6/2016 | Groom et al. |
| 2016/0190838 | A1 | 6/2016 | Webb |
| 2016/0324701 | A1 | 11/2016 | Cambridge et al. |
| 2017/0035295 | A1 | 2/2017 | Collins, Jr. et al. |

OTHER PUBLICATIONS

"Quality Gaming and Multimedia Accessories," CTA®, [online] ctadigital.com, Apr. 24, 2016 [retrieved on Oct. 12, 2017]. Retrieved from the Internet: <URL: http://web.archive.org/web/20160424204832/http://www.ctadigital.com:80/, 5 pages.

RAM® Torque ¾™-1" Diameter Handlebar/Rail are with 1" Ball Medium Arm and X-Grip® Mounts, rammount.com, [online] RAM® Mounts, rammount.com, Jun. 6, 2016, Retrieved from the Internet: <URL: https://web.archive.org/web/20160616011725/http:www.rammount.com/part/RAM-B-408-75-1-UN7U>, 3 pages.

* cited by examiner

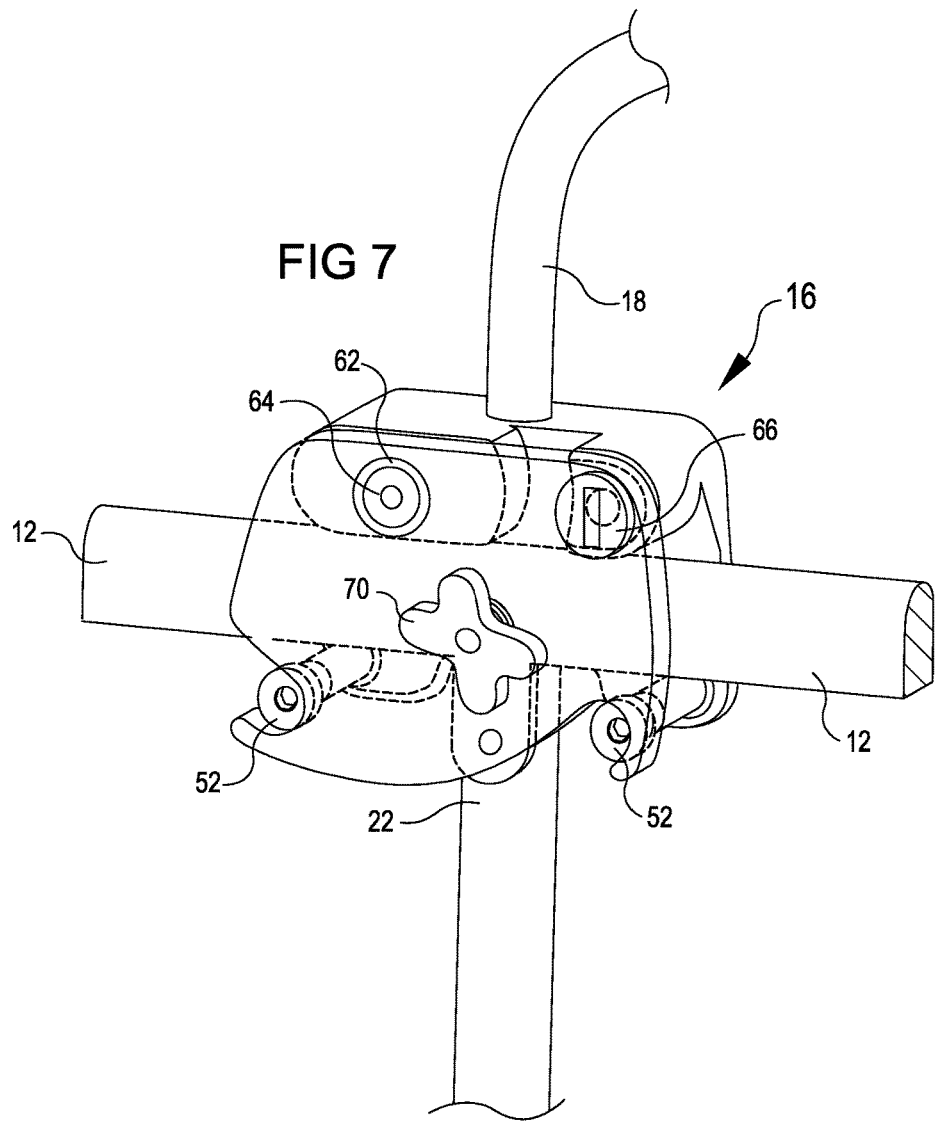

ELECTRONIC DEVICE MOUNT FOR RELEASABLY ATTACHING TO EQUIPMENT IN A HOSPITAL ROOM

CROSS REFERENCE TO RELATED APPLICATION

This application claims the benefit of U.S. Provisional Application No. 62/430,761, filed Dec. 6, 2016, the entire contents of which are hereby incorporated by reference in its entirety for all purposes.

BACKGROUND

Digital tablets and other electronic devices are becoming more popular and prevalent in modern day lifestyles. Hospitals are seeing more need for the electronic devices for patients, either for communication, education, or video conferencing through a device to the patient who is in a hospital bed, or for communication to others, entertainment, and so forth of the patient. However, often, a patient cannot support the electronic device or does not have the ambulation to move and utilize the device. In addition, even if a patient has ambulation, an electronic device may not be in a readily available position, may not be conveniently located, or a patient may become tired and no longer be able to support the device.

BRIEF SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

Embodiments herein are directed to a device for attaching an electronic or digital device, such as a tablet, to a hospital bed side rail. The device includes a connector for attaching to the bed side rail, an arm connected to the connector, and an electronic device holder mounted at an opposite end of the arm. The connector can be designed to fit a particular side rail, or can be adjustable to fit multiple sized rails. The connector, which can be a clamp or other connecting structure, can be lockable to prevent theft. The electronic device holder is configured to receive a digital device, such as a tablet, laptop computer, phone, or other electronic device. The arm is, in embodiments, articulating, flexible, rotatable, and/or otherwise configurable to allow positioning of the electronic device holder in a desired position relative to the patient. In embodiments, the arm is flexible, bendable, articulable, or otherwise configurable to move the electronic device holder relative to the anchored connector. Thus, after the connector is attached to the side rail, the arm can be moved to position the electronic device holder for a patient in the hospital bed or to a caregiver beside the bed. As alternatives, a rigid arm can be used, or the clamp or connector could be directly connected to the electronic device holder.

The connector can take a number of different configurations, but in an embodiment includes a rear plate spaced apart from and rotatably mounted relative to a front plate. The front plate and rear plate fit on opposite sides of a bed side rail, and a bar, which extends downward from the side rail, can be captured between the plates. The close spacing of the front plate and the rear plate cause the side rail and the bar to be fitted close to both of the plates, and the tight fitting and mounting location of the plates to the bar prevents rotation of the connector when force or weight is applied to the arm. In embodiments, the front plate is attached at one side to the rear plate by a rotation pin. The front plate rotates about the pin and then attaches and at the other side to one or more leg pins that extend outward from the rear plate. Alignment structures can be used to align the front plate and lock it into position with the pins. A lock can be provided for locking the front plate to the back plate, securing the connector to the side rail.

In embodiments, the connector is mounted over a bar juncture of the side rail. Thus, the rear and front plates are positioned on opposite sides of the side rail, and the bar, which extends vertically, extends downward from between the front and rear plates. A tightening structure, such as a knob, can be provided that is threaded into one of the rear or front plates and can be tightened against the side rail and/or the bar. This tightening knob provides some resistance to rotation of the connector relative to the side rail, but to prevent further rotation, the front and rear plates are of sufficient height and closely spaced from the bar to maintain engagement of the plates with the vertical bar, preventing rotation of the entire device.

Additional embodiments can include detachable power and/or communication cords connected to the electronic device holder and connectable to a power source and/or a communication source. The cords can be designed so that they easily disconnect, such as by magnets or other quick release connectors. When an electronic device is installed in and connected to the electronic device holder, the electronic device is powered by the power cord and/or provides or is provided communication by the communication cord.

For a fuller understanding of the nature and advantages of the present invention, reference should be made to the ensuing detailed description and accompanying drawings.

BRIEF DESCRIPTION OF THE DRAWINGS

The specification makes reference to the following appended figures, in which use of like reference numerals in different figures is intended to illustrate like or analogous components.

FIG. 7 shows the connector of FIG. 6 is a closed position and fully installed on the bed rail.

DETAILED DESCRIPTION

Figure 1:
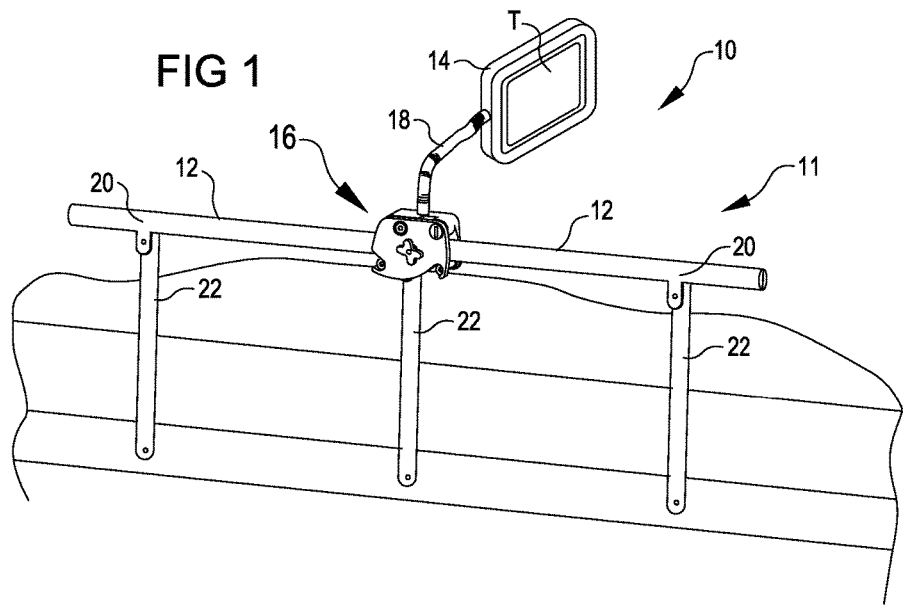
FIG. 1 is perspective view of a device for attaching an electronic or digital device to a bed in accordance with embodiments, with the device attached via a connector to a side rail of a bed.

In the following description, various embodiments of the present invention will be described. For purposes of explanation, specific configurations and details are set forth in order to provide a thorough understanding of the embodiments. However, it will also be apparent to one skilled in the art that the present invention may be practiced without the specific details. Furthermore, well-known features may be omitted or simplified in order not to obscure the embodiment being described.

As is known, a hospital bed or hospital stretcher is a patient holder specially designed for hospitalized patients or others in need of some form of health care. As used herein throughout this disclosure, a "bed" refers to any patient holder. Hospital beds have special features both for the comfort and well-being of the patient and for the convenience of health care workers. Common features include adjustable height for the entire bed, the head, and the feet, adjustable side rails, and electronic buttons to operate both the bed and other nearby electronic devices. Hospital beds and other similar types of beds are used not only in hospitals, but in other health care facilities and settings, such as nursing homes, assisted living facilities, outpatient clinics, and in home health care.

Many hospital beds have side rails that can be raised or lowered. These rails serve as protection for the patient and sometimes can make the patient feel more secure. There are a variety of different types of side rails designed to prevent falls, provide security for the patient, and/or provide assistance for the patient getting in and out of the bed. The side rails may or may not move with a head portion of the bed that moves upward to allow reclining by a patient.

Embodiments herein are directed to a device for releasably attaching an electronic device holder to a bed side rail, for example for a hospital bed. The device generally includes a connector designed to securely fit to the bed side rail, an electronic device holder, and an arm extending between the electronic device holder and the connector. The connector is configured to releasably and securely mount to the side rail. The arm is, in embodiments, articulating, flexible, rotatable, and/or otherwise configurable to allow positioning of the electronic device holder in a desired position relative to the patient on the bed and/or hospital staff adjacent to the bed. The electronic device holder can be any structure that can support an electronic device. The electronic device can be a mobile phone, a smart phone, a personal digital assistant (PDA), a laptop computer, a desktop computer, a thin-client device, a tablet PC, an electronic book (e-book) reader, or other computing devices or electronic devices.

In some embodiments, the device is designed to fit securely onto a side rail of a hospital bed so that the device does not rotate relative to the side rail. In one such an embodiment, the connector can fit over the side rail and a bar that extends at an angle to the side rail, with the connector engaging both sides of the bar so that limited rotational movement of the connector is permitted after installation.

For example, FIG. 1 shows a perspective view of a device 10 for attaching a digital tablet T to hospital bed side rail 11. In general, the device 10 includes an electronic device holder 14, a connector 16 for attaching to the bed side rail 11, and an arm 18 extending between the connector and the electronic device holder. In FIG. 1, the connector is shown attached to a junction 20 at the top edge of a top rail 12 of the side rail 11 for a hospital bed. The junction is the junction of the top rail 12 and a bar 22 that extends downward from the top rail in a direction that is normally not parallel to the top rail. Bars can extend downward from the top rail in a variety of different ways, depending upon the configuration and function of the side rail. The bar may, for example, extend at a right angle and be fixed relative to the top rail. In other side rails, the bar can be hinged or pivotally attached to the top rail to allow the side rail to swing down out of the way. In still further side rails, the bar and/or the top rail can be stamped out of plastic, for example with the bar being part of a polygon. The bar can also extend downward from an end of the top rail.

The electronic device holder 14 can be any structure that can support an electronic device, such as the tablet T. The electronic device can be a mobile phone, a smart phone, a personal digital assistant (PDA), a laptop computer, a desktop computer, a thin-client device, a tablet, an electronic book (e-book) reader, a controller for the bed or another feature in the room, a nurse call panel, or another computing device or electronic device. The electronic device holder 14 can be any structure that is capable of supporting an electronic device, including a device clamp, which holds two or more sides of an electronic device, a stand that permits a device to sit on top, a mount for supporting or holder an electronic device, one or more magnets for magnetically connecting to an electronic device, a tether, or any other structure that can clamp, friction fit, balance, suspend, or otherwise connect to or support the device. An electronic device holder can be designed to hold several different sized or shaped electronic devices, and could be as simple as a flat surface. The electronic device holder 14 can also include at least one button that provides nurse call communication.

Figure 2:
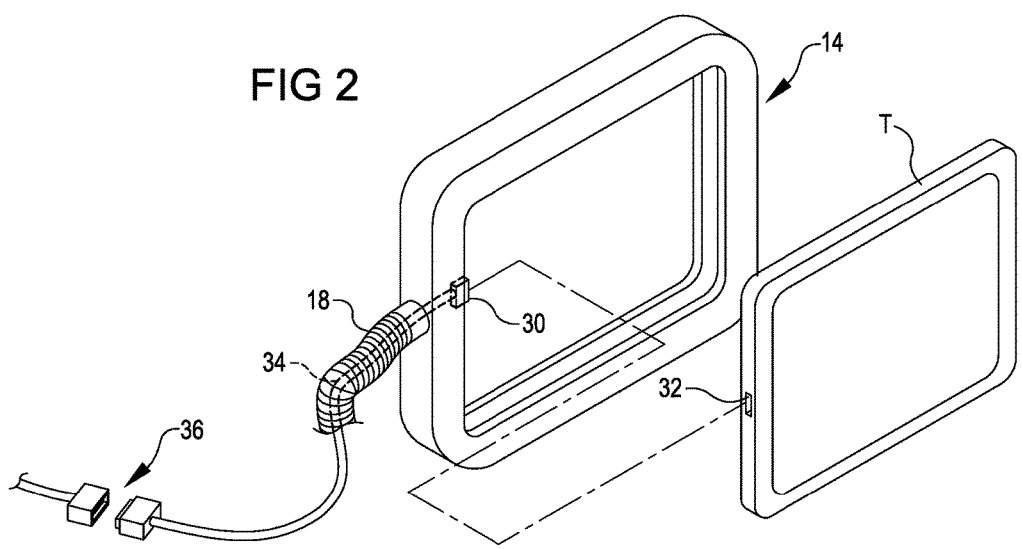
FIG. 2 is a representation of a device having a disconnectable power and/or data cord in accordance with embodiments.

In some embodiments, an electronic device holder can include an electrical connector for providing power and/or communications to the electronic device. In embodiments, such electrical connector includes a charging feature for fitting into a charging port or otherwise connecting to an electronic device to provide power and/or communications to the electronic device. For example, as shown by FIG. 2, the electronic device holder 14 can include a charging plug 30 for fitting into a charging port 32 on the tablet T. As an alternative to the plug 30, a USB or other connection can be provided so that various devices can be connected. Alternatively, the electronic device holder can provide a battery, such as a rechargeable battery, for charging the electronic device.

Power and/or communications can be provided to the electronic device into the charging port 32 via the charging prong 30. In such embodiments, a wire or set of wires can extend through the arm, can be wrapped around the arm, or can extend from the electronic device holder free of the arm. For example, as shown in FIG. 2, a wire 34 extends through the arm 18. In embodiments, the wire can include a releasable connector 36, such as a magnetic connector disclosed in U.S. Pat. No. 9,147,965, for allowing the power and/or communication to be released when the hospital bed is moved and/or the device 10 is released from the bed. As an alternative to a wired connection, the electronic device holder can receive communications wirelessly, and the electronic device can be removed for charging or replacement of batteries. In addition, cordless charging can be provided at the electronic device holder.

The arm is, in embodiments, articulating, flexible, rotatable, and/or otherwise configurable to allow positioning of the electronic device holder in a desired position relative to the patient. By providing an arm that is movable while the connector remains anchored to the side rail, the arm and the electronic device holder can be moved to a position out of the way in an emergency, but yet the electronic device holder is still supported by the connector via the side rail. In embodiments, the arm is not only movable, but also remains steady when positioned to a desired location, such as over a patient or out to the side of a hospital bed for access by a caregiver. To this end, the arm can include sliding, locking pieces to allow movement and then steady positioned, or can have a flexible nature that resists, but allows, bending along its length. For example, the flexible adjustable shafts that are used for gooseneck lamps could be used. In addition, a coiled metal tube could be used for the arm.

As indicated previously, the arm can be hollow for permitting wires to extend along its length. Additionally, the device or device holder can be tethered to the connector, which itself could contain the wires. In addition, in alternate embodiments, an arm could be rigid and fixed in place, or rigid and rotatable about a pivot at or near the connector. Also, in embodiments, the electronic device holder can be directly connected to the connector, or two or more arms can be used. As used herein, an "arm" is any structure that suspends the electronic device holder from the connector.

By providing an arm that is movable while the connector remains anchored to the side rail, the arm and the electronic device holder can be moved to a position out of the way in an emergency, but yet the electronic device holder is still supported by the connector via the side rail. Thus, after the connector is attached to the side rail, the arm can be moved to position the electronic device holder to a desired position.

As is described above, hospital beds typically include two or four side rails, one each along each side of the bed. Often, there are two side rails on each side of the bed with, for each side of the bed, a rail is located near the head of the bed, and a second rail is located near the foot of the bed. Side rails come in a variety of styles, shapes and sizes, but some embodiments described herein are directed to connectors that can attached to side rails having junctions. That is, side rails that have a bar intersecting with a horizontal bar, such as a top rail of the side rail. For example, in FIG. 1, there are several junctions 20 at the intersections of the top rail 12 and the bar 22. A junction does not have to be at the top rail, but it is often more convenient for installation of the connector if the junction is at the top rail. Also, although shown at nearly a right angle to the top rail 12 in FIG. 1, the adjoining bar, which extends at least partly vertically, can extend at any angle to the top rail. In addition, as described above, for many side rails, the rails are hinged so that they can swing downward, remaining parallel and at a constant distance from the side of the bed, but lowering while moving towards the foot or head of the bed.

In accordance with some embodiments, the connector is designed to releasably connect over and secure to a junction of a side rail, such as the junction 20. In embodiments, the connector extends over and captures the top of the top rail 12 and along a length of both sides of the bars 22. In examples, a structure is provided on each side of the bar 22 to prevent movement of the connector along the bar. In addition, in embodiments, the connector engages or is closely spaced from opposite outside edges of the bar 22. This configuration prevents the connector from freely rotating around the top rail 12, securing the connector and the device in place.

In general, in accordance with some embodiments, the connector, when installed on a rail, such as the top rail 12, includes two main sets of features for keeping the connector from moving relative to the rail. A first set includes structures that extend against sides of the top rail and bar, trapping the two and preventing or limiting rotation of the connector on the top rail. The second set includes three features: one extending over a top of a rail, such as the top rail 12, and the other two extending on opposite sides of the rail. The top feature positions the connector against gravity, and the other two limit movement along the top rail due to possible engagement with the bar.

The connector can include other features. For example, a tightening structure can be provided for tightening the connector to the top rail or the bar. In addition, a locking mechanism can be provided for locking the connector to the side rail. Also, in embodiments, the connector is connectable utilizing a single hand, allowing support of the electronic device holder with the other hand.

Figure 3:
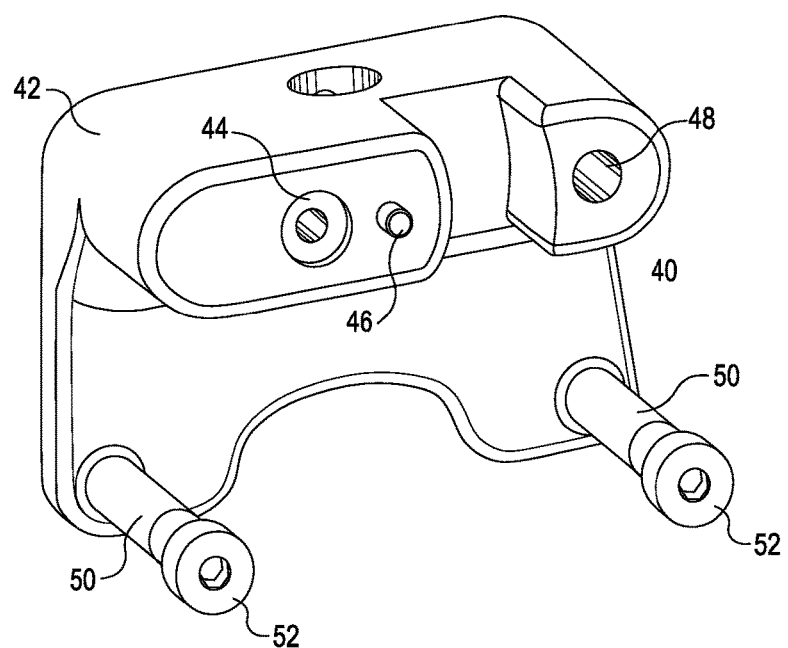
FIG. 3 shows a rear plate of the connector of FIG. 1 in accordance with embodiments.
Figure 4:
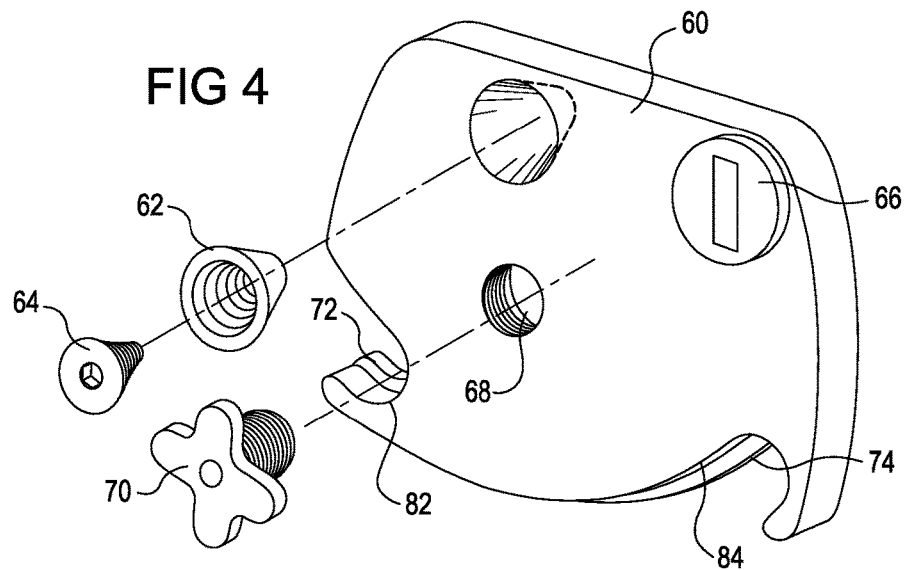
FIG. 4 shows a front of a front plate for the connector of FIG. 1 in accordance with embodiments.
Figure 5:
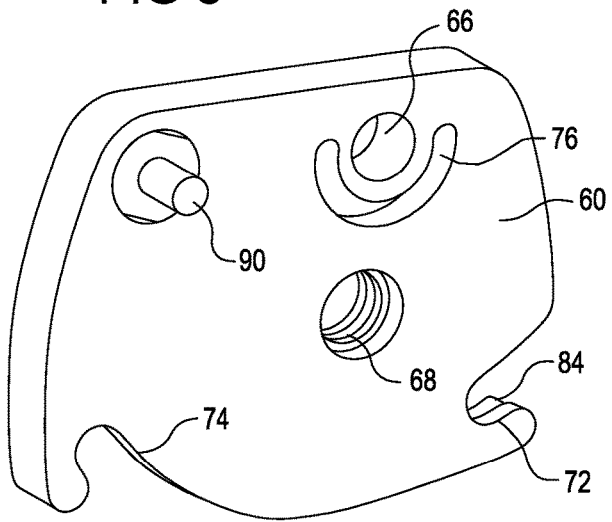
FIG. 5 shows a rear view of the front plate of FIG. 4.
Figure 6:
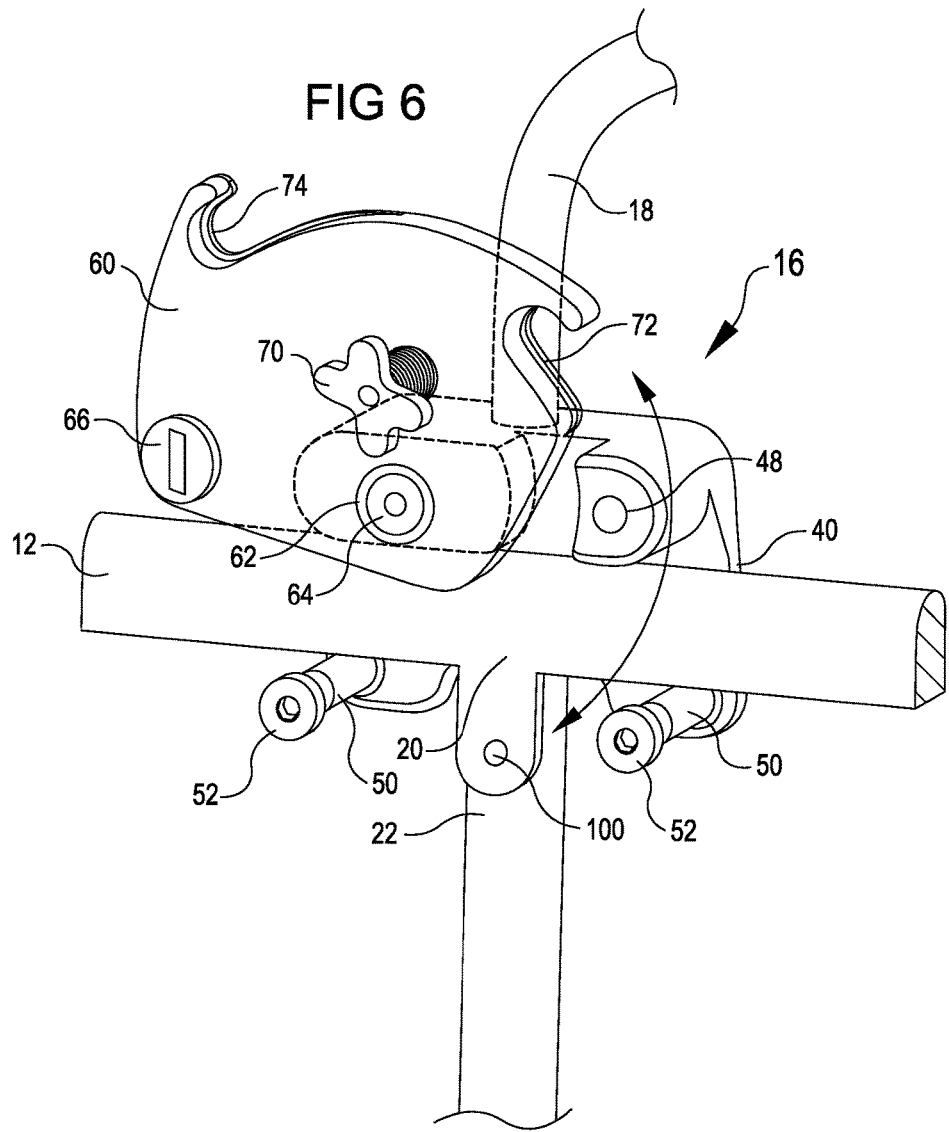
FIG. 6 is an assembled view of the connector of FIGS. 1 and 3-5, with the connector shown in an open configuration just before installation on a side rail of a bed in accordance with embodiments.

An example of a connector 16 is shown in FIG. 1, with parts shown in FIGS. 3, 4, and 5. In general, as shown in FIG. 6, the connector 16 includes a rear plate 40 that is installed behind the junction 20 with a front plate swung to an open position. The front plate 60 is then rotated downward to capture the front side of the T-juncture 20, as shown in FIG. 7. The connector can be removed by rotating the front plate back upward.

As can be seen in FIG. 3, the connector 16 includes the rear plate 40 having a top flange 42 to which the arm 18 is attached. The flange 42 includes a circular door hinge receiving hole 44, a rotation stop pin 46, and a receiving push lock hole 48. A pair of clamp leg pins 50 extends outward from bottom edges of the rear plate 40 and include heads 52 at their distal ends. A front plate 60, or door, shown in FIG. 4, is rotatably mounted to the rear plate 40 via a conical rotation door hinge 62 and screw 64. When the front plate 60 is assembled to the rear plate 40, these two pieces fit into the circular door hinge receiving hole 44 on the rear plate 40.

A lock face 66 is provided on the front plate 60 that engages with the receiving push lock hole 48 on the rear plate 40. These together provide a locking mechanism, utilizing a key (not shown), for locking the front plate 60 relative to the rear plate 40 when the front plate is installed and moved to the closed position shown in FIG. 7.

The front plate 60 also includes a threaded hole 68 for receiving a threaded tightening knob 70. A pair of slots 72, 74 is provided on the front plate. The first slot 72 of the slots is located on the left edge of the front plate 60, adjacent to the bottom edge of the front plate. The second slot 74 is located near the right edge of the front plate, on a bottom edge of the plate. The slots are arranged to receive the clamp leg pins 50 on the rear plate 40, as described more below.

When installed, the front plate 60 is rotatably mounted to the rear plate 40 via the conical rotation door hinge 62 and screw 64, which fit into the circular door hinge receiving hole 44 on the rear plate 40. When the front plate 60 is assembled to the rear plate 40, the rotation stop pin 46 is received in an arcuate slot 76 on a rear face of the front plate. The engagement of the rotation stop pin 46 with the arcuate slot 76 limits rotation of the front plate 60 relative to the rear plate 40.

To install the connector 16 on the top rail 12 of a hospital bed, the front plate 60 is swung to the open position shown in FIG. 6 around the connection of the conical rotator door hinge 62 to the circular door hinge receiving hole 44. The conical rotation door hinge 62 provides a smooth rotation of the front plate 60 about the screw 64 that is attached in the circular door hinge receiving hole 44. The rotation stop pin 46 limits travel of the front plate 60 by engagement of the stop pin with opposite ends of the arcuate slot.

The rear plate 40 is then installed around the juncture of the bar 22 and the top rail 12, as shown in FIG. 6. In this position, the flange 42 engages the top of the top rail, to prevent the connector from moving downward due to gravity, as previously described. The pins 50 extend on opposite sides (front and rear) of the bar 22. Once installed, the pins 50 limit movement of the connector along the length of the top rail because any movement would be limited by engagement of the pins with the bar. Other structures can be positioned at the front and rear of the connector to provide this function.

As the front plate is rotated to the position shown in FIG. 7, the clamp leg pins 50 align with the slots 72, 74 to lock the door in place. Step shelves 82, 84, shown in FIG. 4, engage the heads 52 of the clamp leg pins 50 attached to the rear plate 40. The step shelves 82, 84 ensure full alignment of the heads 52 of the clamp leg pins 50 into the ends of the slots 72, 74 on the bottom of the front plate 60. With the screw and conical rotation door hinge 62 fitting precisely in the circular door hinge receiving hole 44, the front plate 60 swings and precisely engages the clamp leg pins 50, with any amount of off-alignment being corrected by the alignment caused by engagement of the step shelves 82, 84 with the heads 52. A stiff front plate 60 aids in preventing the front plate from losing alignment over time due to warping. Thus, the front plate 60 swings freely and into a clicking engagement with the clamp leg pin heads 50, providing audible and visual feedback for full connection between the front and rear plates. This process can be done by one hand, freeing the other hand to support the electronic device holder 14.

After the front plate is in position, the locking mechanism can be engaged (e.g., by locking the lock face 66 with a key (not shown), extending a lock pin 90 (FIG. 5) into the receiving push lock hole 48), to lock the front plate 60 into position relative to the back plate 40. The tightening knob 70 can then be turned in the threaded hole 68 on the front plate 68 so that the shank of the tightening knob engages the top rail 12. As such, the connector 16 is firmly placed into contact with the top rail 12. In addition, as shown in FIG. 7, the front plate 60 and rear plate 40 extend downward closely against opposite sides of the bar 22 so that any release by the tightening knob of the top rail 12 is countered by engagement of the front or rear plate with the bar. Thus, over time as the tightening knob 70 loosens, the positioning of the front plate and rear plate adjacent the sides of the bar limits the ability of the device to rock on the side rail, aiding in stability of the device. As an alternative, the connector can be anchored in place on the rail, for example by fasteners.

When attached to the side rail of a hospital bed, the device does not impede movement of the side rail up and down relative to the bed. Instead, the connector remains clamped onto the side rail as the side rail moves up and down. To this end, if the bar 22 is hinged to the top rail, for example at 100 in FIG. 6, then the pins 50 are located where they do not interfere with the rail as it extends down, but are also positioned where they can prevent movement along the length of the side rail as described previously. In FIG. 6, the hinge 100 is spaced downward from the top rail, so the pins do not have to be positioned too close to the top rail, but in embodiments, the pins may have to be arranged so that they are tightly fitted against the bottom of the top rail. Thus, a connector may need to be custom designed to fit particular side rail structures, but the connector can still maintain the advantages described herein.

The front plate, rear plate, and pins extend around all four sides of the crossrail, and the pins and rear plate flange extend on opposite sides of the top rail. To include structures on opposite sides of each of these rails, at least one element has to be releasably connected to the others so that the connector can open to fit into place and the at least one element can be connected to lock the connector around the top rail and bar. In the embodiments described above, the releasably connected element is the front plate, but other element(s) could be movable, slidable, removable, rotatable or otherwise releasably connected to allow the connector to be installed.

Other variations are within the spirit of the present invention. Thus, while the invention is susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A device for connecting to a side rail of a hospital bed or stretcher, the side rail comprising a top rail and a bar connected to the top rail, the device comprising:
 a connector for installing on the side rail, the connector comprising:

a first side structure for positioning against a first side of the side rail when the connector is installed on the side rail;

a second side structure for positioning against a second side of the side rail, opposite the first side, when the connector is installed on the side rail;

a top structure extending between the first and second side structures for engaging a top surface of the top rail when the connector is installed on the side rail;

a front structure connected to the first side structure and the second side structure; and a rear structure connected to the first side structure and the second side structure;

the connector being connectable so that the connector can be positioned in (1) a closed position where the top structure is positioned above the top rail, and the front structure and rear structures are arranged on opposite sides of the bar, and the first and second side structures are positioned on opposite sides of both the bar and the top bar and a (2) an opened position where at least one connection is released to permit installation of the connector on the bar and the top rail; and at least one of an electronic device or an electronic device holder connected to the connector.

2. The device of claim 1, further comprising an arm between the connector and the electronic device or the electronic device holder.

3. The device of claim 2, wherein the arm is flexible.

4. The device of claim 2, further comprising a cord extending along the arm, the cord for providing at a first end at least one of power or communication to an electronic device in the electronic device holder.

5. The device of claim 4, wherein the cord comprises a magnetic connector for releasably connecting the first end from at least one of a source of power or communication.

6. The device of claim 1, wherein the front and rear structures are positioned so as to allow folding down of the side rail when the connector is connected to the side rail.

7. The device of claim 1, wherein the first side structure is rotatably mounted to the top structure to permit the releasable attachment of the connector.

8. The device of claim 1, wherein the front and rear structures are pins, and wherein the first side structure includes slots for engaging the pins.

9. A hospital bed or stretcher, comprising:
a patient holder;
a side rail connected to the patient holder and comprising a top rail and a bar extending down from the top rail;
a device for connecting to the side rail, the device comprising:
a connector for installing on the side rail, the connector comprising:
a first side structure for positioning against a first side of the side rail when the connector is installed on the side rail;
a second side structure for positioning against a second side of the side rail, opposite the first side, when the connector is installed on the side rail;
a top structure extending between the first and second side structures for engaging a top surface of the top rail when the connector is installed on the side rail;
a front structure connected to the first side structure and the second side structure; and
a rear structure connected to the first side structure and the second side structure;
the connector being connectable so that the connector can be positioned in (1) a closed position where the top structure is positioned above the top rail, and the front structure and rear structures are arranged on opposite sides of the bar, and the first and second side structures are positioned on opposite sides of both the bar and the top bar and a (2) an opened position where at least one connection is released to permit installation of the connector on the bar and the top rail; and
at least one of an electronic device holder or electronic device connected to the connector.

10. The hospital bed of claim 9, further comprising an arm between the connector and the at least one of the electronic device holder or electronic holder.

11. The hospital bed of claim 10, wherein the arm is flexible.

12. The hospital bed of claim 10, further comprising a cord extending along the arm, the cord for providing at a first end at least one of power or communication to an electronic device in the electronic device holder.

13. The hospital bed of claim 12, wherein the cord comprises a magnetic connector for releasably connecting the first end from at least one of a source of power or communication.

14. The hospital bed of claim 13, wherein the front and rear structures are positioned so as to allow folding down of the side rail when the connector is connected to the side rail.

15. The hospital bed of claim 9, wherein the first side structure is rotatably mounted to the top structure to permit the releasable attachment of the connector.

16. The hospital bed of claim 15, wherein the front and rear structures are pins, and wherein the first side structure includes slots for engaging the pins.

* * * * *